(12) United States Patent
Cathelin et al.

(10) Patent No.: US 7,920,036 B2
(45) Date of Patent: Apr. 5, 2011

(54) FREQUENCY TUNING CIRCUIT FOR LATTICE FILTER

(75) Inventors: Andreia Cathelin, Laval (FR); Stephane Razafimandimby, Granoble (FR); Andreas Kaiser, Villeneuve d'Ascq (FR)

(73) Assignees: STMicroelectronics S.A., Montrouge (FR); Centre National de la Recherche Scientifique, Paris (FR)

( * ) Notice: Subject to any disclaimer, the term of this patent is extended or adjusted under 35 U.S.C. 154(b) by 193 days.

(21) Appl. No.: 12/203,003

(22) Filed: Sep. 2, 2008

(65) Prior Publication Data

US 2009/0072925 A1  Mar. 19, 2009

(30) Foreign Application Priority Data

Sep. 3, 2007 (FR) .................................... 07 06161

(51) Int. Cl.
*H03H 9/54* (2006.01)
*H03H 3/04* (2006.01)
(52) U.S. Cl. ........ 333/188; 333/190; 333/17.1; 333/193
(58) Field of Classification Search .......... 333/169–171, 333/174, 175, 188–192, 193, 195, 17.1
See application file for complete search history.

(56) References Cited

U.S. PATENT DOCUMENTS

| | | | |
|---|---|---|---|
| 3,697,903 A | 10/1972 | Sauerland | 333/72 |
| 3,731,230 A | 5/1973 | Cerny, Jr. | |
| 5,036,299 A | 7/1991 | Dick et al. | 331/25 |
| 5,043,681 A | 8/1991 | Tanemura et al. | 331/107 |
| 5,053,937 A | 10/1991 | Blöckl | |
| 5,235,640 A | 8/1993 | Devries et al. | 380/13 |
| 5,291,159 A | 3/1994 | Vale | |
| 5,446,306 A | 8/1995 | Stokes et al. | 257/416 |
| 5,608,360 A | 3/1997 | Driscoll | 331/107 A |
| 5,714,917 A | 2/1998 | Ella et al. | 332/144 |
| 6,653,913 B2 | 11/2003 | Klee et al. | 333/188 |

(Continued)

FOREIGN PATENT DOCUMENTS

DE     10234685     2/2004

(Continued)

OTHER PUBLICATIONS

Akbari-Dilmaghani, R., et al., "A High Q RF CMOS Differential Active Inductor," in Proceedings of the IEEE Electronics, Circuits and Systems Int'l. Conference, Lisbon, Portugal, Sep. 7-10, 1998, pp. 157-160.

(Continued)

*Primary Examiner* — Barbara Summons
(74) *Attorney, Agent, or Firm* — Lisa K. Jorgenson; Timothy L. Boller; Seed IP Law Group PLLC (57) ABSTRACT

A lattice tunable filtering circuit includes a first input and a second input, and a first output and a second output. The circuit includes two series branches and two parallel branches. The first and second series branches include a Tunable Resonator Component (TRC) which presents a first series resonance frequency whereas the third and fourth parallel branches present a second series resonance frequency which has a value being lower than that of the first series resonance frequency. The first and second series resonance frequencies are tunable by one analog control quantity. The filtering circuit further includes a feedback control loop for the control of the analog quantity, which feedback is based on a criterion of equality between the modulus of impedances Zs and Zp.

20 Claims, 7 Drawing Sheets

U.S. PATENT DOCUMENTS

| | | | |
|---|---|---|---|
| 6,876,056 B2 | 4/2005 | Tilmans et al. | |
| 6,917,789 B1 | 7/2005 | Moloudi et al. | 455/78 |
| 6,924,583 B2* | 8/2005 | Lin et al. | 310/324 |
| 6,927,649 B2 | 8/2005 | Metzger et al. | |
| 6,950,639 B2 | 9/2005 | Gogolla et al. | 455/196.1 |
| 7,030,718 B1 | 4/2006 | Scherer | 333/188 |
| 7,065,331 B2 | 6/2006 | Korden et al. | 455/150.1 |
| 7,135,940 B2 | 11/2006 | Kawakubo et al. | 333/17.1 |
| 7,183,640 B2 | 2/2007 | Mazzochette et al. | |
| 7,187,240 B2 | 3/2007 | Cathelin et al. | 333/2 |
| 7,194,247 B2 | 3/2007 | Tikka et al. | |
| 7,218,181 B2 | 5/2007 | Razafimandimby et al. | 333/107 |
| 7,274,274 B2 | 9/2007 | Carpentier et al. | 333/188 |
| 7,279,962 B2* | 10/2007 | Chen et al. | 327/553 |
| 7,319,371 B2 | 1/2008 | Ten Dolle et al. | |
| 7,345,554 B2 | 3/2008 | Cathelin et al. | 331/154 |
| 7,696,844 B2* | 4/2010 | Cathelin et al. | 333/190 |
| 2001/0028277 A1 | 10/2001 | Northam | 331/34 |
| 2004/0227578 A1 | 11/2004 | Hamalainen | 331/107 |
| 2005/0266823 A1 | 12/2005 | Cathelin et al. | 455/344 |
| 2005/0280476 A1* | 12/2005 | Abe et al. | 331/17 |

FOREIGN PATENT DOCUMENTS

| | | |
|---|---|---|
| FR | 2455816 | 11/1980 |
| FR | 2864726 | 7/2005 |
| FR | 2864728 | 7/2005 |
| FR | 2864729 | 7/2005 |
| FR | 2864733 | 7/2005 |
| GB | 615 841 | 1/1949 |
| JP | 10-294636 | 11/1998 |
| WO | 02/25813 | 3/2002 |
| WO | 2004/066495 | 8/2004 |

OTHER PUBLICATIONS

Bradley, P., et al., "A Film Bulk Acoustic Resonator (FBAR) Duplexer for USPCS Handset Applications," IEEE MTT-Symposium, pp. 367-370, 2001.

Carpentier, J. F., et al., "21.3—A SiGe:C BiCMOS WCDMA Zero-IF RF Front-End Using an Above-IC BAW Filter," IEEE International Solid-State Circuits Conference, pp. 394-395, 2005.

Carpentier, J. F., et al., "A Tunable Bandpass BAW-Filter Architecture and Its Application to WCDMA Filter," IEEE MTT-Symposium, pp. 221-224, 2005.

De Los Santos, H., FR MEMES Circuit Design for Wireless Communications, "5.3 Film Bulk Acoustic Wave Filters," Artech House, 2002, pp. Cover-IV and 163-167.

Gopinathan, V., et al., "Design Considerations for High-Frequency Continuous-Time Filters and Implementation of an Antialiasing Filter for Digital Video," IEEE Journal of Solid-State Circuits, vol. 25, No. 6, pp. 1368-1378, Dec. 1990.

Karsilayan, A., et al., "Automatic Tuning of Frequency and Q-Factor of Bandpass Filters Based on Envelope Detection," ISCAS '98, Proceedings of the 1998 IEEE International Symposium on Circuits and Systems, pp. 65-68, 1998.

Koroglu, M., et al., "A 1.9Ghz Image-Reject Front-End with Automatic Tuning in a 0.15 μm CMOS Technology," in Proceedings of the IEEE Int'l. Solid State Circuits Conference, San Francisco, CA, Feb. 9-13, 2003, pp. 1-10.

Lakin, K. M., et al., "Improved Bulk Wave Resonator Coupling Coefficient for Wide Bandwidth Filters," IEEE Ultrasonics Symposium, pp. 827-831, 2001.

Li, D., et al., "Design Techniques for Automatically Tuned Integrated Gigahertz-Range Active LC Filters," IEEE Journal of Solid-State Circuits, vol. 37, No. 8, pp. 967-977, Aug. 2002.

Razafimandimby, S., et al., "Nouvelle Configuration de filtre RF accordable en frequence utilisant des resonateurs BAW pour une chaine de reception homodyne WCDMA," 6e Colloque TAISA 2005, 4 pages.

Razafimandimby, S., et al. "A Novel Architecture of a Tunable Bandpass BAW-filter for a WCDMA Transceiver," Analog Integr. Circ. Sig. Process, vol. 49, pp. 237-247, 2006.

Schmidhammer, E., et al., "Design Flow and Methodology on the Design of BAW Components," IEEE MTT-Symposium, pp. 233-236, 2005.

Tilhac, C., et al., "A Bandpass BAW-Filter Architecture with Reduced Sensitivity to Process Variations," IEEJ Analog VLSI Workshop 2005, 5 pages.

Ueda, M., et al., "High-Q Resonators Using FBAR/SAW Technology and their Applications," IEEE MTT-Symposium, pp. 209-212, 2005.

Vale, G., et al., "FBAR Filters at GHz Frequencies," Forty-Fourth Annual Symposium on Frequency Control, Westinghouse Electric Corp., IEEE, 1990, pp. 332-336.

* cited by examiner $$H = \frac{(Z_s - Z_p)}{(Z_s + Z_p)}$$

FREQUENCY TUNING CIRCUIT FOR LATTICE FILTER

TECHNICAL FIELD

The present disclosure generally relates to the field of electronic circuits, and more particularly but not exclusively to a frequency tuning circuit for a lattice type filter.

BACKGROUND INFORMATION

Extensive researches are performed in the field of electronic filters since the significant development of mobile communication which calls for very effective RF filtering circuits.

Therefore, in accordance with the more recent mobile communications of the type UMTS, 3G or WCDMA, it is necessary to extract different closely related channels within a same range of frequencies.

To achieve this, it is necessary to use very selective filters with small levels of insertion losses. Acoustic resonators, which offer a high level of quality factor, show to be a major component for the design of such filtering circuits.

Two particular structures have been classically used in the art, the so-called "ladder" structure and the "lattice" structure.

Figure 1:
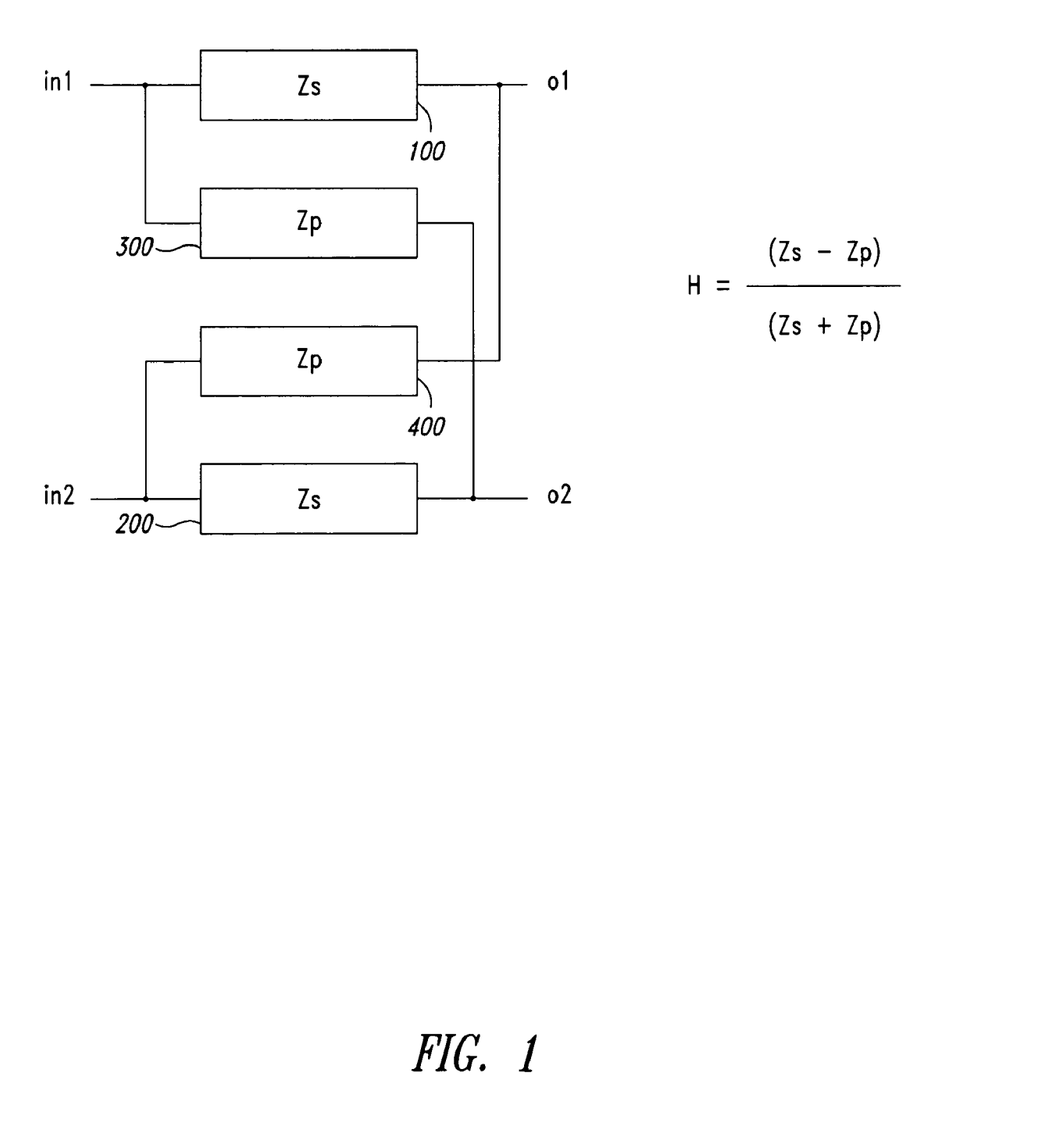
FIG. 1 illustrates the structure of a lattice filter comprising two series impedance Zs 100 and 200, and two parallel impedance Zp 300 and 400, as well as the H transfer function of that filter.

FIG. 1 recalls the general architecture of one "lattice" structure which comprises first and second series impedances Zs, 100 and 200, with third and fourth parallel impedances Zp 300 and 400.

Generally speaking, in order to compensate for the internal dispersions of the components which constitute the filter, the series impedance Zs and the parallel impedance Zp are carried out by a tunable resonating circuit, generally under control of an electric quantity.

The tuning of the different components of the "lattice" structure is then achieved by a sophisticated adaptive control loop which allows the filter to fit the desirable requirements, despite the inaccuracies resulting from the manufacturing processes, the aging of the electronic components, and the variation of temperature as well as that of the power voltage.

Several adaptive mechanisms are known in the art.

The following documents disclose techniques which are already known for tuning a lattice filter, based on one master-slave architecture.

"*Design Considerations for High-Frequency Continuous-Time Filters and Implementation of an Antialiasing Filter for Digital Video*", Venugopal Gopinathan, Yannis P. Tsividis, Khen-Sang Tan, Richard K. Hester, IEEE, 1990.

"*Design Techniques for automatically Tuned Integrated Gigahertz-Range Active LC Filters*", Dandan Li, Yannis Fellow, IEEE, 2002.

The following document discloses another technique for tuning a lattice filter:

"*Automatic tuning of frequency and Q-factor of bandpass filters based on envelope detection*", Aydin Ilker Karplayan and Rolf Schaumann, IEEE, 1998.

French patent application no. FR 04 03492 filed on Apr. 2, 2004 by the assignee of this application (and which corresponds to U.S. Pat. No. 7,187,240) also discloses the principle of a master-slave adaptive control of a filtering circuit based on a BAW resonator allowing the tuning of the resonance parameters of a "slave" filter with respect to the parameters of a dual "master" filter, the latter being incorporated within the adaptive control loop.

French patent application no. FR 04 03493 filed on Apr. 2, 2004 by the assignee of the present application (and which corresponds to U.S. Pat. No. 7,345,554) describes the incorporation of the "master" structure within one adaptive control loop of the type Phase Locked Loop (P.L.L.).

French patent application no. FR 04 03494 also filed on Apr. 2, 2004 by the assignee of the present application (and which corresponds to U.S. Pat. No. 7,218,181) discloses the integration of the "master" structure within an Amplitude Locked Loop (ALL).

At high frequencies, one particular critical issue has appeared, e.g., the fact that the circuits composing the direct environment of the resonators introduce many parasitic elements (parasitic capacitances etc.) spoiling the ideal working operation, and the principle according to which the "master" structure should be the ideal image of the "slave" structure, thus ascertaining a perfect adaptive control process.

The filtering effect of the lattice filter is achieved by the resonance of elements Zs and Zp, and their cooperation. Elements Zs and Zp sometimes show multiples resonance frequencies, some of them being useful for the filtering process, and others being not.

BRIEF SUMMARY

The operation of the master-slave adaptive control loop should be made in such a way that master and slave elements are used on the same frequency resonance. This is one major issue which is solved by one of the present embodiments.

An embodiment provides one alternative adaptive control loop, being particularly suitable for the range of high frequencies, and which moreover avoids any unnecessary duplication of resonators used for constituting the lattice filter.

One embodiment provides a frequency tuning circuit for a lattice filter which remains simple to manufacture and still effective to use.

Another embodiment provides a frequency tuning circuit for a lattice filter which can be operated at high frequencies, extending the range of values of 1 Ghz, thanks to a quick transfer of the frequency processing tuning at lower frequency values.

One embodiment provides a lattice tunable filtering circuit comprising a first and a second inputs, and a first and a second outputs. The circuit comprises two series branches and two parallel branches. The first and second series branches comprise a Tunable Resonator Component (TRC) which presents a first series resonance frequency whereas the third and fourth parallel branches present a second series resonance frequency having a value being lower than the value of the first series resonance frequency. The first and second series resonance frequencies are tunable by one analog control quantity (Vc).

The filtering circuit of one embodiment further comprises a feedback control loop for the control of said analog quantity, which feedback is based on a criterion of equality between the modulus (i.e., an absolute value) of complex impedance Zs and the modulus of complex impedance Zp.

In one particular embodiment, the resonator components comprise one inductive element and one capacitive element, one of which being tunable by said analog control quantity (Vc).

In one particular embodiment, the resonator components include the combination of one inductor and one varactor.

In one particular embodiment, the resonator components each comprise one acoustic resonator and two partner elements, one element being of inductive type and the other being of capacitive type, one of which being tunable by said analog control quantity.

In particular for an embodiment, the resonator components comprise one BAW type resonator associated with an inductor and a varactor.

The resonators in the parallel branches can in one embodiment comprise a loading layer so as to ensure that said second series resonance frequency is lower than the first series resonance frequency of the resonators within the series branch.

In one embodiment, the feedback control loop includes:
  a frequency generator for generating a signal having a magnitude and a range of frequencies;
  a first block comprising a fifth acoustic resonator being identical to said first and said second acoustic resonators of the series branches and which is tunable by the analog control quantity (Vc);
  a second block comprising a sixth acoustic resonator which is identical to said third and said fourth acoustic resonators of the parallel branches and which is tunable by the analog control quantity (Vc).

The output of the first and second blocks are respectively forwarded to first and second signal envelope detectors, then transmitted to one comparator for detecting the equality between the electrical quantities at the output of the two blocks.

A feedback control loop circuit, comprising a decision element, is coupled to the output of the comparator and allows the generation of the analog control quantity allowing the tuning of the six resonators.

In one particular embodiment, each of said first and second blocks comprise one voltage divider comprising one resistor and one resonator, being respectively identical to the resonators within the series branch or within the parallel branch.

In one particular embodiment, the feedback control loop circuit comprises:
  a successive approximation register (SAR) for performing a dichotomy determination of the Most Significant Bits (MSB) and then the Less Significant Bits (LSB);
  a digital to analog converter for generating the analog control quantity (Vc) from the value stored within the SAR register.

BRIEF DESCRIPTION OF THE SEVERAL VIEWS OF THE DRAWINGS

Other features of one or more non-limiting and non-exhaustive embodiments will best be understood by reference to the following detailed description when read in conjunction with the accompanying drawings.

DETAILED DESCRIPTION

In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

There is now described the realization of one lattice type filtering circuit providing high performance, which is particularly suitable for achieving one RF filtering circuit for mobile telecommunications. In particular, it will be described a filter which is useful for realizing a Wide Code Division Multiplexing Access (WCDMA) type receiver operating at a frequency of 2.14 Ghz.

Features of the embodiment(s), however, can be adapted to other applications, and particularly but not exclusively to other frequencies. If the lattice filter allows it, the frequency tuning solution which is hereinafter described can be used for allowing reconfiguration of the receiver.

Figure 2A:
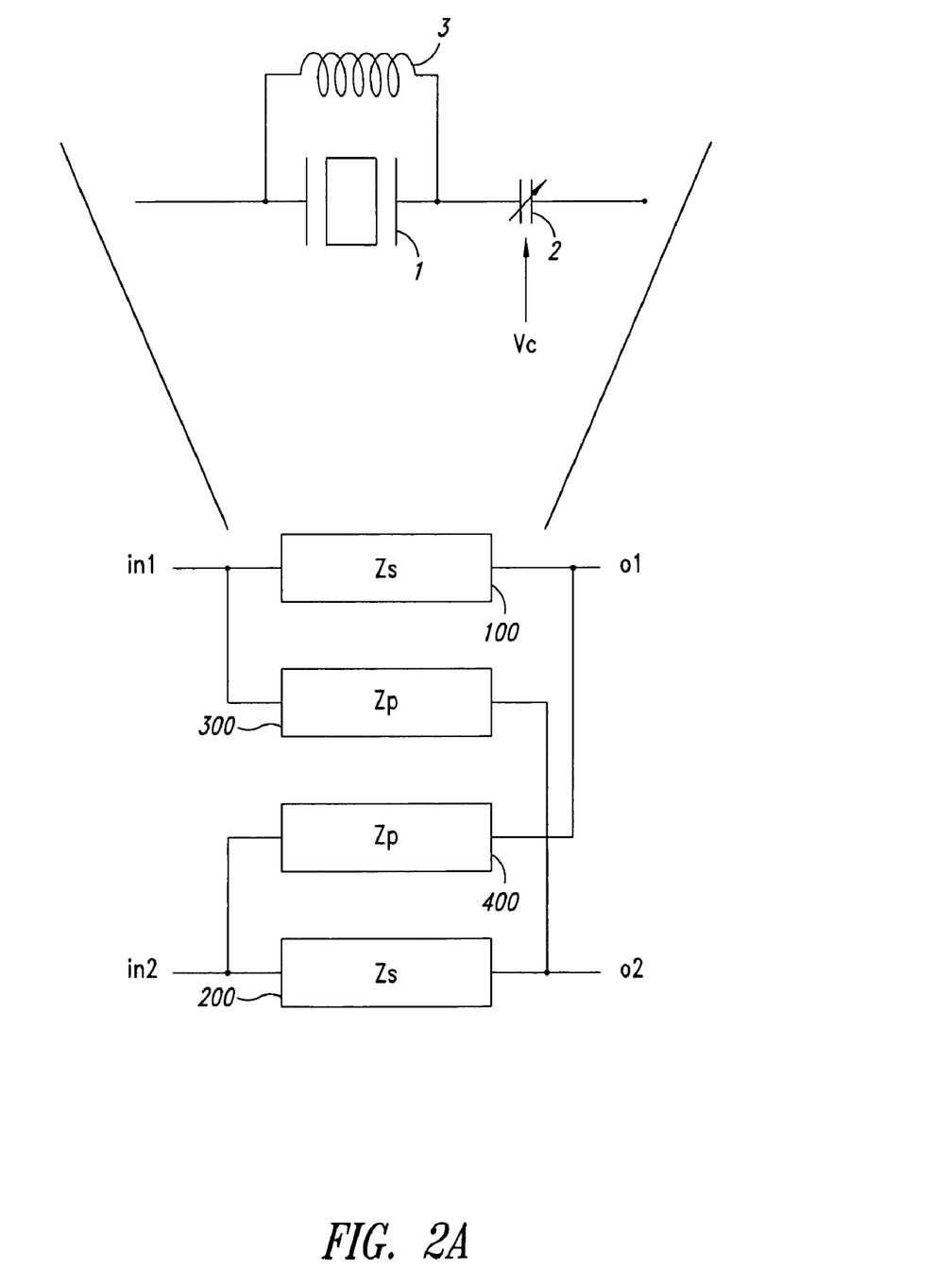
FIG. 2A illustrates one embodiment of a lattice filter which comprises, for each one of the series and parallel impedance, one BAW resonator associated to two partner elements chosen so as to achieve a band pass filter.

The filtering circuit is fitted with bulk acoustic wave (BAW) type resonators. In such a context, the lattice structure comprises Tunable Resonator Components (TRC), as illustrated in FIG. 2A and disclosed in French patent application no. FR 03 15480 (corresponding to U.S. Pat. No. 7,274,274) which was filed on Dec. 29, 2003.

Each one of the series and parallel frequencies thus results from one BAW type acoustic resonator 1 and two partner elements, such as a varactor 2 and an inductor 3.

In one particular embodiment, impedance Zp is carried out by resonators comprising one additional loading layer so as to move the series and parallel resonance frequencies towards lower frequencies. The use of the so-called loading process is well known to a skilled man and will not be further elaborated.

Generally speaking, it should be recalled that a BAW type resonator is based on a dielectric medium arranged on a reflecting element, such as a Bragg mirror for instance. Layers having different acoustic properties and different dielectric constants are stacked on a silicon substrate. Such an acoustic element is known as a Surface Mounted Resonator (SMR). Alternatively, the resonator could be of the Film Bulk Acoustic Resonator type (FBAR), namely a resonator located above a cavity to allow the reflection of acoustic waves and to avoid damping thereof.

Figure 2B:
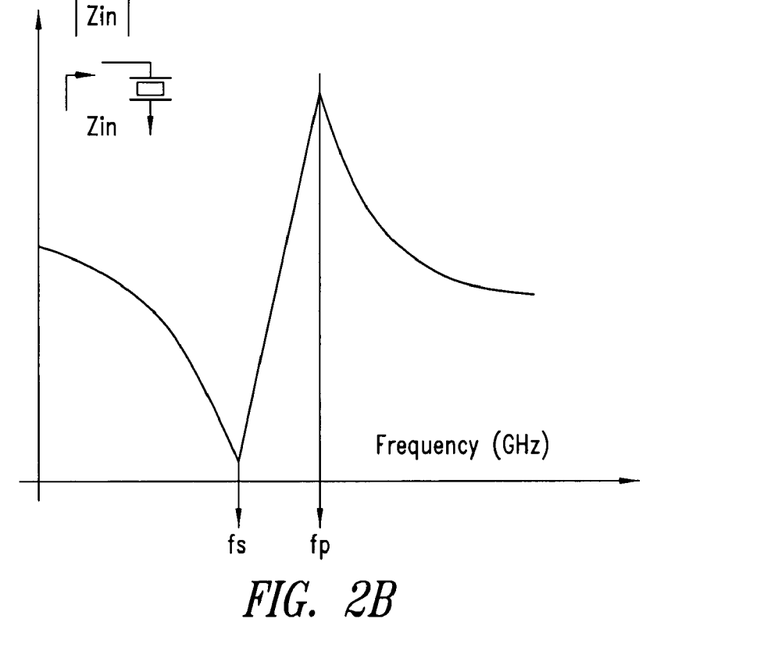
FIG. 2B illustrates the characteristic curve of one embodiment of a BAW type acoustic resonator, showing the resonance and anti-resonance frequencies.

A BAW resonator has two very close resonant frequencies, $f_s$ (series) and $f_p$ (parallel) respectively, as illustrated in FIG. 2B.

Figure 3:
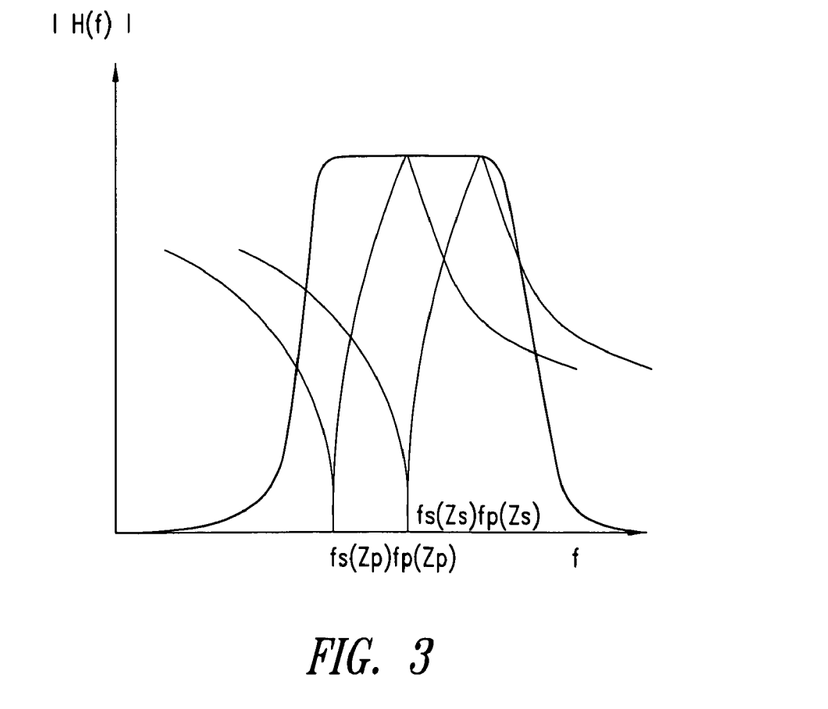
FIG. 3 illustrates a band-pass type transfer function which is achieved by one embodiment of the circuit of FIG. 2A.

In order to realize a Tunable Resonator Components (TRC) with a BAW resonator, one combines the latter with at least two partner elements and, particularly, with a first inductive partner element (represented by inductor 3 in FIG. 2A), variable or fixed, active or passive, which is entered into resonance with the intrinsic capacitance of the resonator (resulting from the electrodes) at the vicinity of the resonance and anti-resonance frequencies. In this way, one manages to "move away" the anti-resonance frequency shown in FIG. 3 from the useful range of frequencies, and which might spoil the operation of the band-pass filter. As a consequence, there only remains, within the useful range of frequencies, only the two "bottom" peaks which correspond to the series resonance frequencies, slightly moved because of the "loading" layer in resonators Zp.

The second partner element is generally a capacitive element (such as illustrated by varactor 2 in FIG. 2A) and it generally varies according to an electric signal, for example electric signal $V_{tune}$.

Figure 4:
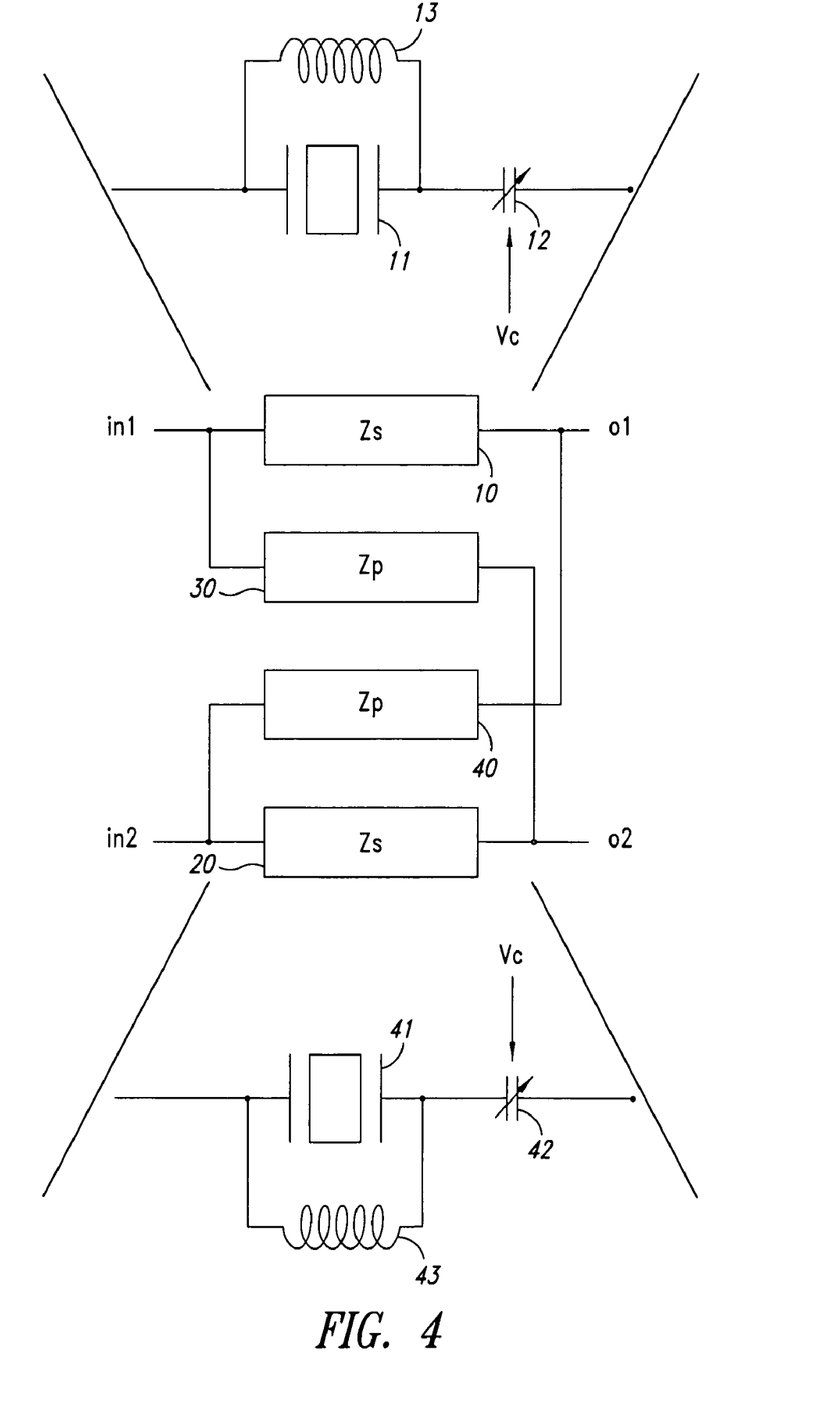
FIG. 4 illustrates one embodiment of a lattice structure comprising series and parallel impedances which are realized by BAW resonators, respectively with and without loading.

FIG. 4 thus illustrates the structure of a lattice filter, the series impedance of which (resp. parallel) comprising of a resonator 11 (resp. 41) associated to its two partner elements, that is to say one tunable capacitive element 12 (resp. 42) and one inductive element 13 (resp. 43) which operates so as to move away the anti-resonance frequency from the useful working frequency range.

In one particular embodiment, the variable capacitive elements are varactors which are controlled by one analog voltage Vc.

Figure 5:
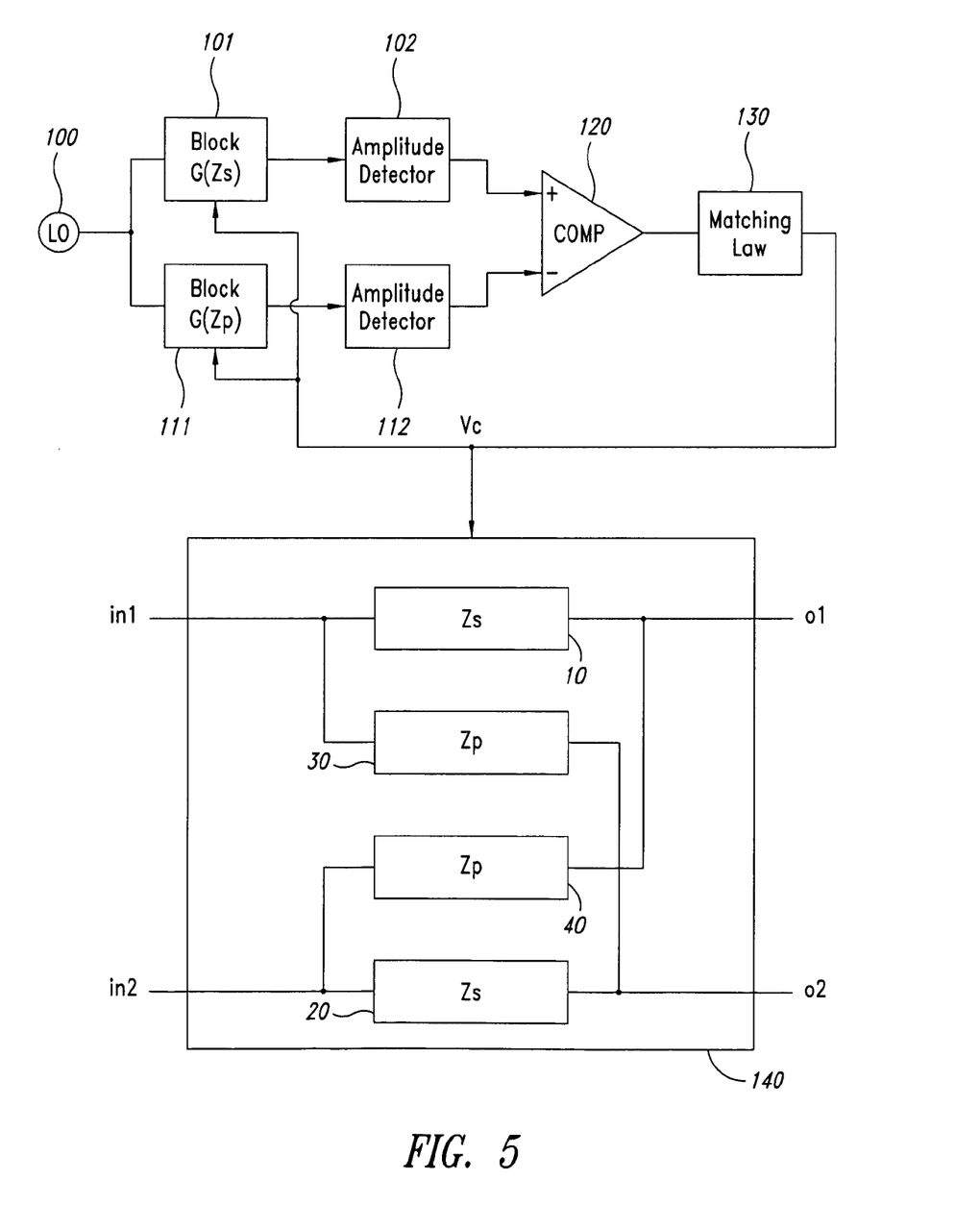
FIG. 5 illustrates the general principle of the adaptive control of the lattice filter in accordance with one embodiment.

FIG. 5 illustrates the general principle of adaptive control of a lattice filter 140, as shown in FIG. 4, which, for the sake of clarity, will use the same reference numerals as those in FIG. 4.

The adaptive control loop comprises one local oscillator (100) which generates one electrical signal, the frequency of which varies in a range comprising the useful band of frequencies which is considered.

That oscillator is coupled to two inputs (terminals), respectively to one input of a first block 101 (G(Zs)) and to one input of a second block 111 (G(Zp)), each block producing one analog signal from the reference signal generated by oscillator 100, but also in response to the value of their internal resonator, respectively series or parallel, associated to its two partner elements.

Block 101 has one output (terminal) which is coupled to the input of one amplitude detector 102, the output of which being coupled to the positive input of a comparator 120 for comparing electrical values around the null frequency.

Block 111 has one output (terminal) which is coupled to the input of one amplitude detector 112, the output of which being coupled to the inverting input of comparator 120.

Comparator 120 generates an analog signal which is representative of the difference between the electrical signals respectively applied at its two inputs, which output signal is introduced via a feedback loop comprising feedback block 130 comprising an analog and/or digital decision block which defines a matching law for generating an analog quantity Vc which not only controls the BAW resonator located within filter 140 and also controls everyone of the BAW resonators of blocks 101 and 111.

Alternatively, the adaptive control can be directly embodied by digital processing.

One sees that it is possible to achieve an adaptive control circuit which is still simple to manufacture since it is not based on the knowledge of the absolute values of the amplitudes generated by blocs 101 and 111—what is certainly difficult to obtain—but it is based on the knowledge of the relative difference. Indeed, the criterion for the adaptive feedback control is simply based on the equality between the two values produces by blocks 101 and 111, respectively. In addition, the same control signal Vc allows the control of all the resonators, what even more simplifies the realization of the filter.

The filter is thus easier to designed and still effective.

Moreover, one can also notice that the adaptive control of the filter only requires two additional resonators, what does not significantly increases the manufacturing costs.

One particularly notes that there is no need to duplicate the lattice filter.

At last, and this is an aspect of one embodiment, the circuit operates in a satisfactory way even at frequency values being higher than 1 Ghz.

Figure 6:
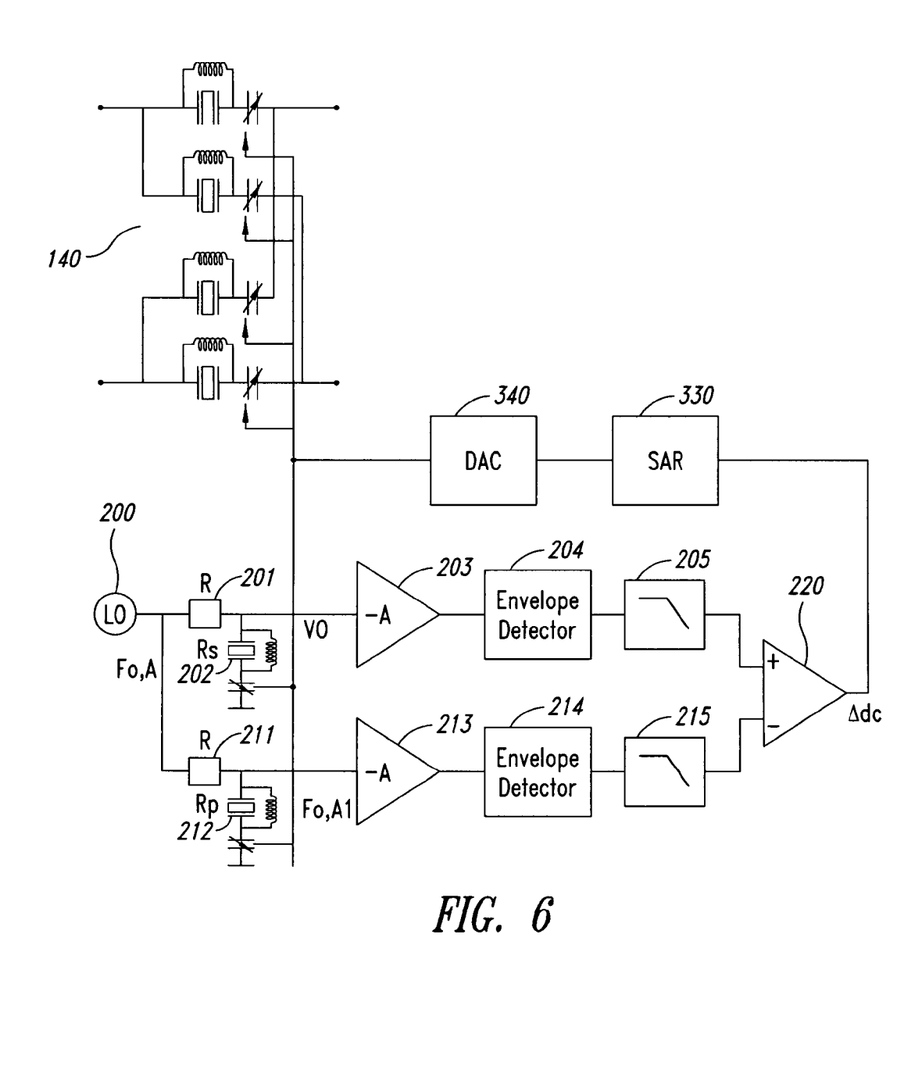
FIG. 6 illustrates one particular embodiment of one adaptive control system.

FIG. 6 illustrates one particular embodiment of the adaptive control circuit which was described above.

The circuit comprises one oscillator 200 being identical to oscillator 100 of FIG. 5.

Block 1 of FIG. 6 comprises, in series, one voltage dividing block which comprises a resistor 201 and one TRC 202 (comprising of a BAW resonator accompanied by its two partner elements), an amplifier 203, an envelope detector 204, followed by a low-pass filter 205.

Thus, the voltage divider provides a voltage which is equal to equal to Zs/(R+Zs) the value of the voltage generated by oscillator 200, which is forwarded to the input of voltage amplifier 203. The latter generates at its output an output signal which is forwarded to envelope detector 204 which produces a signal which is equal to the maximum value of the input signal, and then forwarded to low-pass filter 205 before being introduced in the positive input of a comparator 220.

Similarly, block 2 of FIG. 6 comprises, in series, one voltage divider comprising a resistor 211 and one TRC 222, one amplifier 213, one envelope detector 214, followed by one low-pass filter 215, the output signal of which being forwarded to the inverting input of comparator 220.

Comparator 220 generates at its output one binary information Δdc (1 or 0), which is then forwarded to a Successive Approximation Register (SAR) 330 allowing a fast conversion of the information produced by the comparator.

One will notice that SAR 330 is based on a dichotomy approximation principle, which determines first the Most Significant Bits (MSB) before the Less Significant Bits (LSB), what ensures a quick conversion process for this embodiment.

In one particular embodiment, the register comprises four bits which are then converted under analog form by one digital-to-analog converting circuit 340, which finally generates the Vc control voltage of the different resonators.

The circuit described above shows another feature resulting from the presence of the low pass filters 205 and 215, which allows a downstream process of the comparator for low frequencies, that is to say frequencies below a few Mhz. Therefore, one ascertains that this low frequency process will not spoil the performance of the circuit operating at high frequencies (several Ghz).

Figure 7:
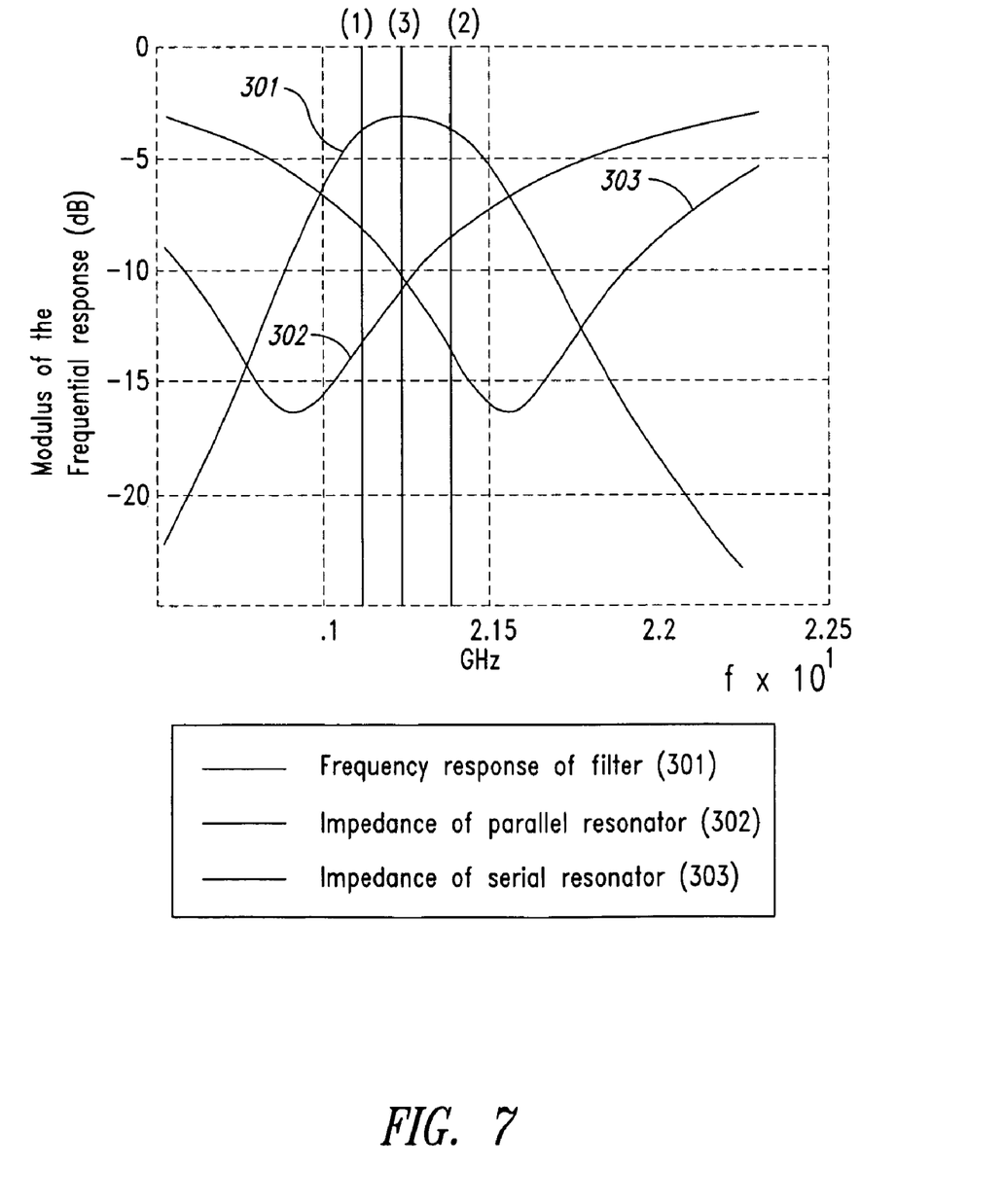
FIG. 7 illustrates the frequency operation of the circuit of FIG. 6 in accordance with one embodiment.

FIG. 7 more particularly illustrates the operation of the adaptive control circuit. The parallel impedance curve is represented in connection with reference 302, whereas series impedance curve is represented in connection with reference 303. One sees that the series resonance frequency of curve 303 which is characteristics of the resonator in the series path (Zs) is located more on the right than curve 302 of the resonator in parallel path (Zp). Or, in other words, the resonators of the parallel path of the filter do enter into resonance at a lower frequency thanks to the additional "loading" which they received.

Curve 301 thus illustrates the band-pass which results from the transfer function of the filter, which can be precisely tuned as described above.

The adaptive control circuit which was described above is particularly suitable for the use of acoustic BAW type resonators which provides the more interesting possibilities of integration, particularly since those resonators are fully compatible with the conventional manufacturing process on the silicon substrate.

One embodiment can be adapted to the use of lattice filters which would be based on simple L-C resonators, or any resonant circuit which comprises one control input.

The embodiment(s) will then be useful for realizing a filter based on series and parallel impedances, each based on the association of one inductor and one varactor.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A lattice tunable filtering circuit having first and second inputs, and first and second outputs, said circuit comprising:
   a first branch having a series impedance which is coupled between said first input and said first output;
   a second branch having a series impedance which is coupled between said second input and said second output;
   a third branch having a parallel impedance which is coupled between said first input and said second output;
   a fourth branch having a parallel impedance which is coupled between said second input and said first output, wherein
   said first and second branches respectively including first and second tunable resonator components with a first series resonance frequency;
   said third and said fourth branches, respectively including third and fourth tunable resonator components with a second series resonance frequency lower than said first series resonance frequency; and
   said first and second series resonance frequencies being tunable by an analog control quantity; and
   a feedback control loop of said analog control quantity based on a criterion of equality related to said serial and parallel impedances.

2. The lattice tunable filtering circuit according to claim 1 wherein said tunable resonator components include one inductive element and one capacitive element, one of which being tunable by said analog control quantity.

3. The lattice tunable filtering circuit according to claim 1 wherein said tunable resonator components include one inductor and one varactor.

4. The lattice tunable filtering circuit according to claim 1 wherein said tunable resonator components each include one acoustic resonator and two partner elements, one element of which being inductive and another element of which being capacitive, one of said partner elements being tunable by said analog control quantity.

5. The lattice-tunable filtering circuit according to claim 4 wherein said acoustic resonator includes one bulk acoustic wave (BAW) type resonator associated with said two partner elements, which include an inductor and a varactor.

6. The lattice tunable filtering circuit according to claim 5 wherein said bulk acoustic wave resonators of the third and fourth branches include a loading layer so as to ensure that said second series resonance frequency is lower than the first series resonance frequency of the bulk acoustic wave resonators in the first and second branches.

7. The lattice tunable filtering circuit according to claim 4 wherein:
   said tunable resonator components of said first and second branches respectively include first and second acoustic resonators;
   said tunable resonator components of said third and said fourth branches respectively include third and fourth acoustic resonators;
   and wherein said feedback control loop includes:
      a frequency generator to generate a signal having a magnitude and a range of frequencies;
      a first block having a fifth acoustic resonator which is identical to said first and said second acoustic resonators and which is tunable by said analog control quantity, said first block being adapted to generate a first analog quantity;
      a second block having a sixth acoustic resonator which is identical to said third and said fourth acoustic resonators and which is tunable by said analog control quantity, said second block being adapted to generate a second analog quantity;
      first and second envelope detectors which are respectively coupled to outputs of said first and said second blocks;
      a comparator to compare electric quantities to detect occurrence of an equality between said first and said second analog quantities which are respectively generated by said first and said second blocks;
      a feedback control circuit which is coupled to an output of said comparator to generate said analog control quantity that controls said first, second, third, fourth, fifth and sixth acoustic resonators.

8. The lattice tunable filtering circuit according claim 7 wherein:
   said first block includes one voltage divider based on one resistor and on one acoustic resonator being identical to said first and second acoustic resonators; and
   said second block includes one voltage divider based on one resistor and on one acoustic resonator being identical to said third and fourth acoustic resonators.

9. The lattice tunable filtering circuit according to claim 8, further comprising first and second low-pass filters which are adapted to receive respective outputs of said first and second envelope detectors, and which are adapted to generate filtered output signals which are respectively forwarded to inputs of said comparator.

10. The lattice tunable filtering circuit according to claim 9 wherein said feedback control loop includes:
    a successive approximation register (SAR) adapted to perform a dichotomy determination of Most Significant Bits (MSB) and then Less Significant Bits (LSB); and a digital to analog converter adapted to generate said analog control quantity from a value stored within said register.

11. The lattice tunable filtering circuit of claim 1 wherein the criterion of equality related to said serial and parallel impedances comprises an equality between a modulus of the serial impedance and a modulus of the parallel impedance.

12. An apparatus, comprising:
first and second input terminals;
first and second output terminals;
a first resonator circuit coupled between said first input terminal and said first output terminal;
a second resonator circuit coupled between said second input terminal and said second output terminal;
a third resonator circuit coupled between said first input terminal and said second output terminal;
a fourth resonator circuit coupled between said second input terminal and said first output terminal;
wherein said first and second resonator circuits each include an acoustic resonator component having a first series resonance frequency tunable by an analog control quantity;
wherein said third and fourth resonator circuits each include an acoustic resonator component having a second series resonance frequency tunable by said analog control quantity; and
a feedback control circuit, having input terminals coupled to said first, second, third, and fourth resonator circuits, and adapted to adjust said analog control quantity to tune said series resonance frequencies based on signals applied at said input terminals of said feedback control circuit, circuit,
wherein said first and second resonator circuits respectively provide a series impedance;
wherein said third and fourth resonator components respectively provide a parallel impedance; and
wherein said signals applied at said input terminals of said feedback control circuit represent said series and parallel impedances, said feedback control circuit being adapted to adjust said analog control quantity based on an equality criterion related to said series and parallel impedances.

13. The apparatus of claim 12 wherein said acoustic resonator components include bulk acoustic wave (BAW) type resonators.

14. The apparatus of claim 12 wherein each of said resonator circuits include one inductive element and one capacitive element, one of which is tunable by said analog control quantity.

15. The apparatus of claim 12 wherein said second series resonance frequency is lower than said first series resonance frequency.

16. A method for a filter circuit having an arrangement of first, second, third, and fourth resonator circuits each having an acoustic resonator associated with an inductive component and with a capacitive component, the method comprising:
generating an analog control quantity;
applying said generated analog control quantity to said first, second, third, and fourth resonator circuits to tune series resonance frequencies thereof;
receiving outputs representative of said first, second, third, and fourth resonator circuits having said generated analog control quantity applied thereto;
performing an equality determination on said received outputs; and
adjusting said analog control quantity applied to said first, second, third, and fourth resonator circuits according to said equality determination.

17. The method of claim 16 wherein said performing said equality determination on said received outputs includes performing an equality determination on signals representative of serial and parallel impedances respectively associated with said first and second resonator circuits and with said third and fourth resonator circuits.

18. The method of claim 16 wherein said resonator circuits each include a bulk acoustic wave (BAW) type acoustic resonator.

19. The method of claim 16 wherein said performing said equality determination is performed using digital processing.

20. The method of claim 16 wherein said performing said equality determination on said received outputs includes using a comparator to compare said received outputs.

* * * * *

UNITED STATES PATENT AND TRADEMARK OFFICE
CERTIFICATE OF CORRECTION

PATENT NO. : 7,920,036 B2
APPLICATION NO. : 12/203003
DATED : April 5, 2011
INVENTOR(S) : Cathelin et al.

It is certified that error appears in the above-identified patent and that said Letters Patent is hereby corrected as shown below:

Column 9
Claim 12, Line 32, "circuit, circuit," should read as --circuit,--.

Signed and Sealed this
Thirty-first Day of May, 2011

David J. Kappos
*Director of the United States Patent and Trademark Office*